US009786486B2

(12) United States Patent
Brar et al.

(10) Patent No.: US 9,786,486 B2
(45) Date of Patent: Oct. 10, 2017

(54) PARALLEL MULTI WAFER AXIAL SPIN CLEAN PROCESSING USING SPIN CASSETTE INSIDE MOVABLE PROCESS CHAMBER

(71) Applicants: Samsung Electronics Co., Ltd, Gyeonggi-Do (KR); Samsung Austin Semiconductor, L.L.C., Austin, TX (US)

(72) Inventors: Amuldeep S. Brar, Austin, TX (US); Nampyo Lee, Cedar Park, TX (US); Woosung Han, Austin, TX (US)

(73) Assignees: Samsung Electronics Co., Ltd., Suwon-si (KR); Samsung Austin Semiconductor, LP, Austin, TX (US)

( * ) Notice: Subject to any disclaimer, the term of this patent is extended or adjusted under 35 U.S.C. 154(b) by 0 days.

(21) Appl. No.: 14/754,364

(22) Filed: Jun. 29, 2015

(65) Prior Publication Data

US 2015/0303052 A1 Oct. 22, 2015

Related U.S. Application Data

(62) Division of application No. 13/011,052, filed on Jan. 21, 2011, now abandoned.

(51) Int. Cl.

| | |
|---|---|
| ***H01L 21/02*** | (2006.01) |
| ***H01L 21/687*** | (2006.01) |
| ***H01L 21/67*** | (2006.01) |
| ***H01L 21/673*** | (2006.01) |
| ***H01L 21/677*** | (2006.01) |

(52) U.S. Cl.

CPC .. *H01L 21/02041* (2013.01); *H01L 21/67051* (2013.01); *H01L 21/67303* (2013.01); *H01L 21/67346* (2013.01); *H01L 21/67757* (2013.01); *H01L 21/6875* (2013.01); *H01L 21/68728* (2013.01); *Y10T 279/24* (2015.01)

(58) Field of Classification Search

CPC ......... H01L 21/67051; H01L 21/67303; H01L 21/67346; H01L 21/6875; H01L 21/68728; H01L 21/02041; H01L 21/67757; Y10T 279/24

See application file for complete search history.

(56) References Cited

U.S. PATENT DOCUMENTS

| | | | |
|---|---|---|---|
| 4,139,206 | A | 2/1979 | Knohl |
| 5,286,296 | A | 2/1994 | Sato et al. |
| 6,186,877 | B1 | 2/2001 | Lofaro |
| 6,192,903 | B1 | 2/2001 | Doi et al. |
| 6,194,232 | B1 | 2/2001 | Kao |
| 6,478,665 | B2 | 11/2002 | Lofaro |
| 6,808,564 | B2 | 10/2004 | Dietze |

(Continued)

*Primary Examiner* — Alexander Markoff

(57) ABSTRACT

A system and method concurrently processes multiple wafers. A cassette structure includes multiple chucks and a drive spool for supporting and rotating the chucks. Each chuck holds a wafer in position while rotating. The cassette structure is loaded into a process chamber. Each chuck includes a self-locking mechanism that is activated by the centrifugal force generated from the rotation of the chuck. The self-locking mechanism centers and holds a wafer in position with respect to the chuck. A drive motor drives the drive spool, which causes the chucks to rotate. As the chucks are being rotated, a dispensing assembly delivers a processing chemical to the wafers.

20 Claims, 5 Drawing Sheets

110
215
228
225
120
100
WAFER LOADING POSITION

(56) References Cited

U.S. PATENT DOCUMENTS

| | | | | |
|---|---|---|---|---|
| 7,056,392 | B1 * | 6/2006 | Kuroki | H01L 21/68728 134/137 |
| 2002/0013122 | A1 | 1/2002 | Sugaya et al. | |
| 2002/0094684 | A1 | 7/2002 | Hirasaki et al. | |
| 2002/0185153 | A1 | 12/2002 | Hosack et al. | |
| 2003/0164179 | A1 | 9/2003 | Kamikawa et al. | |
| 2003/0219333 | A1 | 11/2003 | Takeuchi | |
| 2003/0232581 | A1 | 12/2003 | Ki | |
| 2004/0194817 | A1 * | 10/2004 | Pope | B08B 7/0021 134/148 |
| 2004/0195785 | A1 * | 10/2004 | Jan | H01L 21/68728 279/106 |
| 2005/0023773 | A1 * | 2/2005 | Matsuzawa | H01L 21/6838 279/35 |
| 2008/0061519 | A1 * | 3/2008 | Cho | B23B 31/1269 279/106 |
| 2008/0102199 | A1 | 5/2008 | Gurary | |
| 2008/0142733 | A1 | 6/2008 | Zywno et al. | |
| 2011/0300297 | A1 | 12/2011 | Celaru et al. | |

* cited by examiner

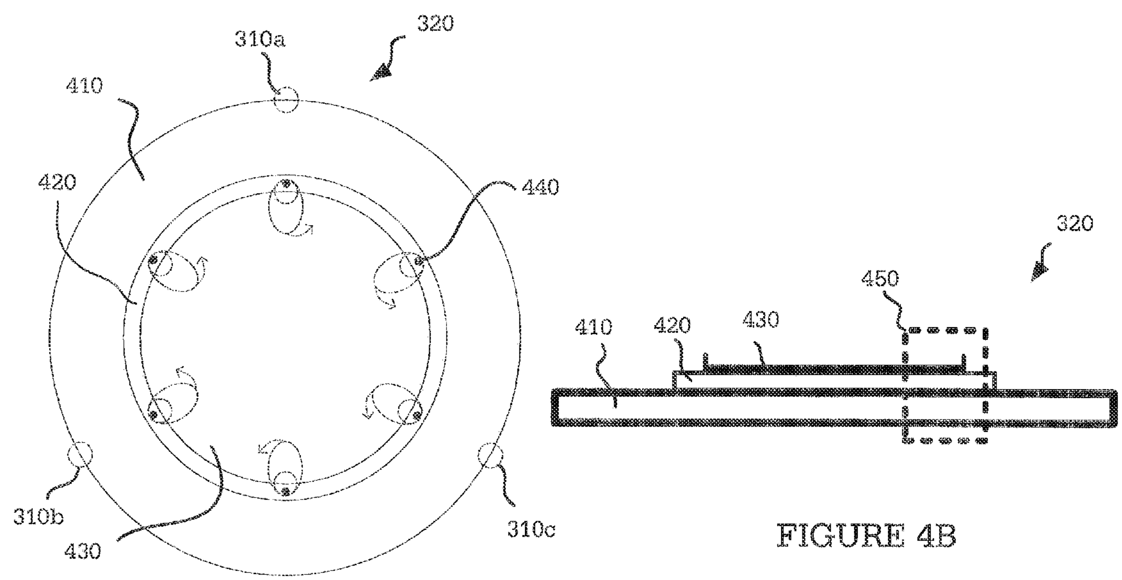
FIGURE 4B
FIGURE 4A
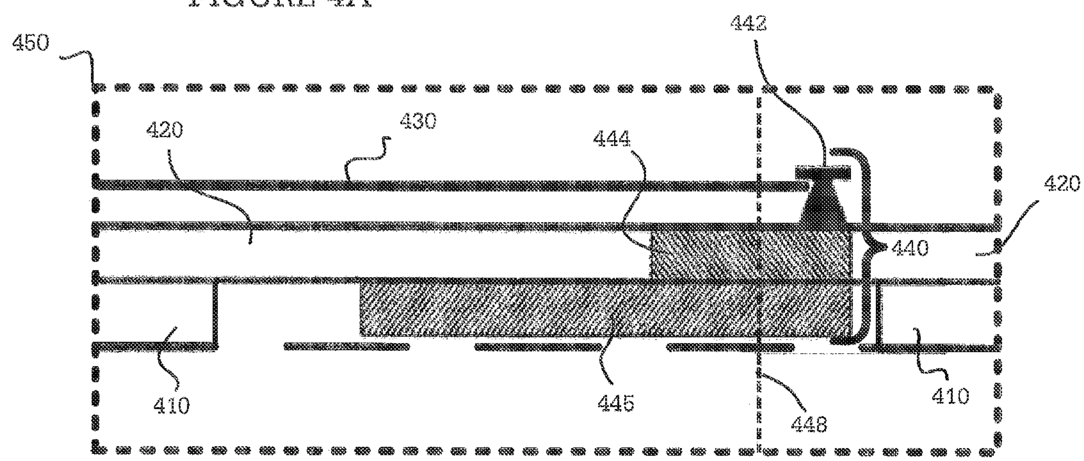
FIGURE 4C

PARALLEL MULTI WAFER AXIAL SPIN CLEAN PROCESSING USING SPIN CASSETTE INSIDE MOVABLE PROCESS CHAMBER

CROSS-REFERENCE TO RELATED APPLICATION AND CLAIM OF PRIORITY

This application is a division of U.S. non-provisional patent application Ser. No. 13/011,052 filed Jan 21, 2011 and entitled "PARALLEL MULTI WAFER AXIAL SPIN CLEAN PROCESSING USING SPIN CASSETTE INSIDE MOVABLE PROCESS CHAMBER". The above-referenced patent document is hereby incorporated by reference into the present application as if fully set forth herein.

TECHNICAL FIELD OF THE INVENTION

The present application relates generally to wafer clean processing and, more specifically, to a method and apparatus for cleaning multiple wafers in parallel using a single cassette and processing chamber.

BACKGROUND OF THE INVENTION

The concept of multi-wafer parallel processing is expensive to fabricate considering the complexity of the design. And there is a limited market demand due to limited processing steps required for single wafer processing, resulting in a lack of return on investment (ROI) justification to pursue simultaneous multi-wafer cleaning. As such, no serious attempt has been made to create equipment for parallel processing of two or more wafers using a single cassette.

Now, because the shrinking geometries on processing chips require single wafer processing at several processing steps, the idea of multi-wafer processing with the efficiency of single wafer cleaning becomes relevant for future cleaning equipment technology. The current throughput issues are being addressed by increasing the fabrication floor space and the number of single wafer tools. Chamber stacking has also been done to reduce the tool footprint, but chambers are still isolated and throughput issues still exist.

SUMMARY OF THE INVENTION

A system for processing multiple wafers is provided. The system includes a cassette structure and a chamber for loading the cassette structure. The cassette structure includes multiple chucks and a drive spool for supporting and rotating the chucks. Each chuck, when rotating, holds a water in position.

A method for cleaning two or more wafers in a single process chamber is provided. The method includes loading multiple wafers onto a set of chucks. Each wafer is placed on one of the chucks, and each chuck is at least partially supported by a drive spool. The cassette structure is loaded into a chamber. The drive spool is rotated to simultaneously rotate the chucks. And each wafer is held in position for processing using the rotation of the plurality of chucks.

An apparatus for processing multiple wafers is provided. The system includes a cassette structure that includes multiple chucks and a drive spool for supporting and rotating the chucks. Each chuck includes a self-locking mechanism to hold a wafer in position while rotating. The system also includes a chamber into which the cassette structure is loaded.

An apparatus for securing a wafer is provided. The apparatus includes a circular plate and a self-locking mechanism. The circular plate includes a substantially planar top surface on which the wafer is placed. The radius of the top surface is greater than a radius of the wafer. The self-locking mechanism centers the wafer about an axis of rotation of the upper circular portion and holds the wafer according to a centrifugal force generated by a rotation of the circular plate.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Although definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 4A illustrates a top view of a floating chuck according to an embodiment of the present disclosure;

FIG. 4B illustrates a cross-sectional view of a floating chuck according to an embodiment of the present disclosure;

FIG. 4C illustrates an exploded cross-sectional view of a self-locking mechanism according to an embodiment of the present disclosure.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wafer processing system.

Figure 1:
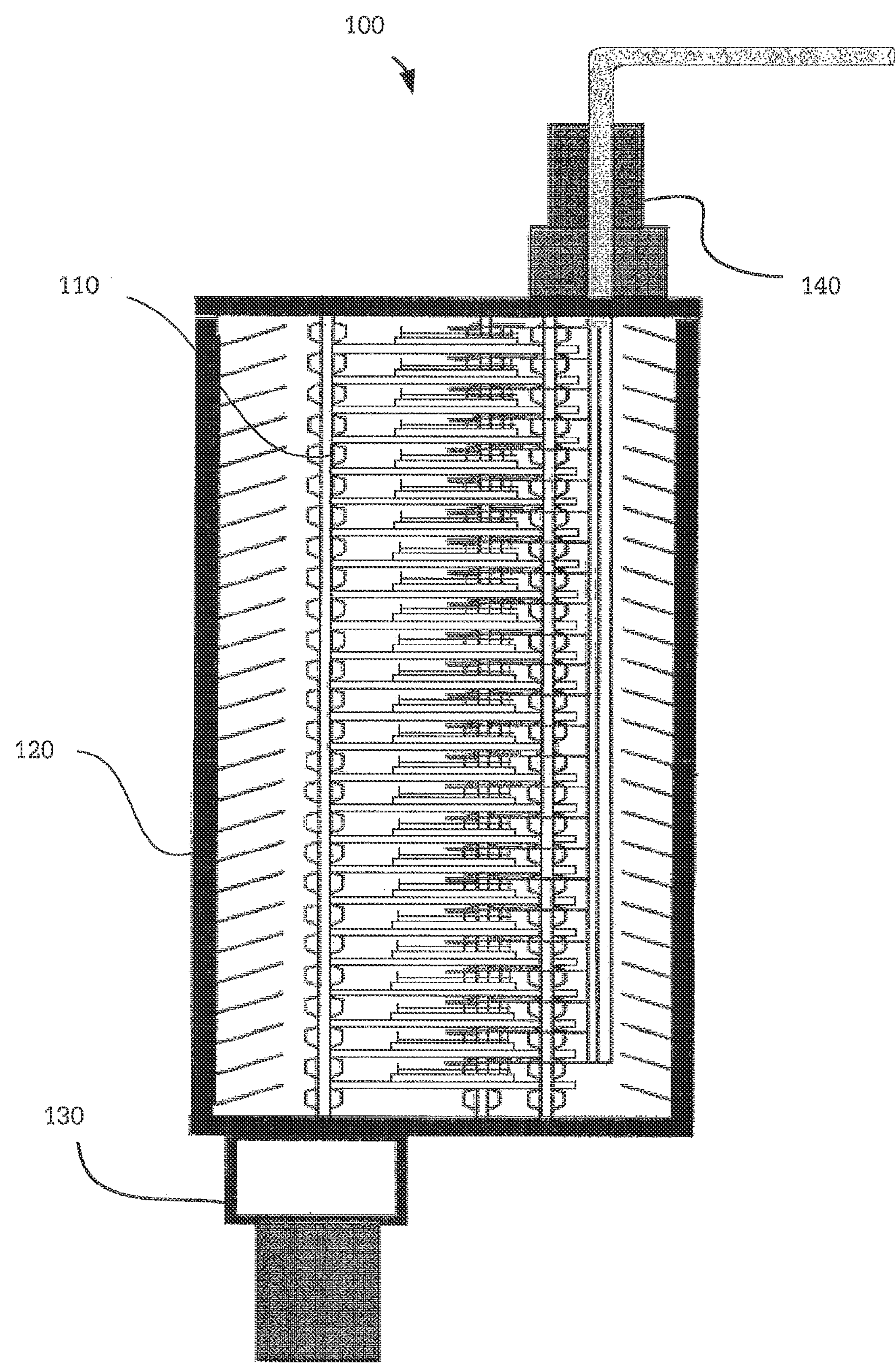
FIG. 1 illustrates a multi-wafer clean processing system according to the present disclosure.

FIG. 1 illustrates a multi-wafer clean processing system according to the present disclosure. The multi-wafer clean processing system 100 includes a process cassette 110, a process chamber 120, a drive motor 130, and a nozzle dispense assembly 140. The multi-wafer clean processing system 100 addresses the throughput limitation of current single wafer cleaning tools by loading two or more wafers at a time.

According to an embodiment, the process cassette 110 allows parallel processing of two or more wafers using an axial spin rotation cleaning process. The process cassette, to be described further detail with regard to FIG. 3, includes floating chucks that are driven by the drive motor 130. The floating chucks are supported on periphery by a plurality of rotating spools that are spindle-like structures, at least one of which is coupled to the drive motor 130. Each of the floating chucks includes a mechanism that self-locks a wafer in positron using the rotational speed of the floating chuck.

The process chamber 120, according to an embodiment, may be moved vertically to allow the loading and unloading of the stationary process cassette 110 into the multi-wafer clean processing system 100. The process chamber 120 and/or the process cassette 110 may also be capable of horizontal motion and provide extra throughput in an embodiment, the process chamber 120 may comprise a substantially cylindrical shape. The process chamber 120, to be described in further detail with regard to FIG. 3, may also include exhaust/drain waffles to prevent backsplash of chemical from the chamber walls to the lower level floating chucks.

The drive motor 130 may be coupled to one of the spools (e.g. a drive spool) of the process cassette 110. In an embodiment, the drive motor 130 may rotate the drive spool using its single drive. Rotating the drive spool may cause the floating chucks to rotate axially and, in turn, cause the other spools to rotate while supporting the floating chucks. The centrifugal force of the rotating chucks will then cause the self-locking mechanism to hold the wafers in place.

Figure 3:
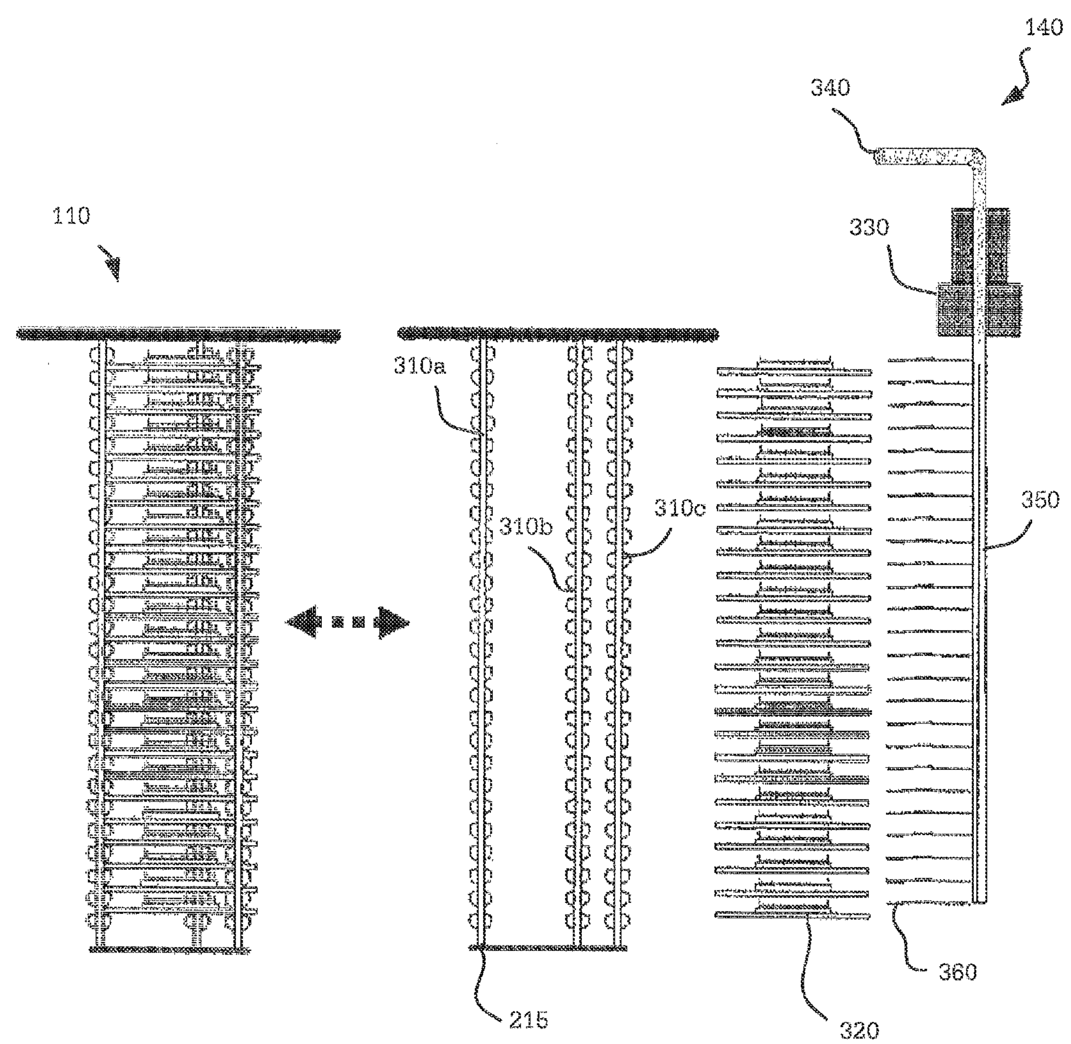
FIG. 3 illustrates a lateral view of a process cassette and a dispensing assembly according to an embodiment of the present disclosure.

The nozzle dispense assembly 140, to be described further with regard to FIG. 3, delivers a cleaning agent (e.g. cleaning chemical or liquefied gas) to the wafers during the cleaning process. In an embodiment, the cleaning agent may be delivered from the top of the multi-wafer clean processing system 100 to each wafer by a common swing system with scanning arms. A scanning arm that includes a separate line to a nozzle may be provided to deliver the cleaning agent to each wafer, separately.

Figure 2:
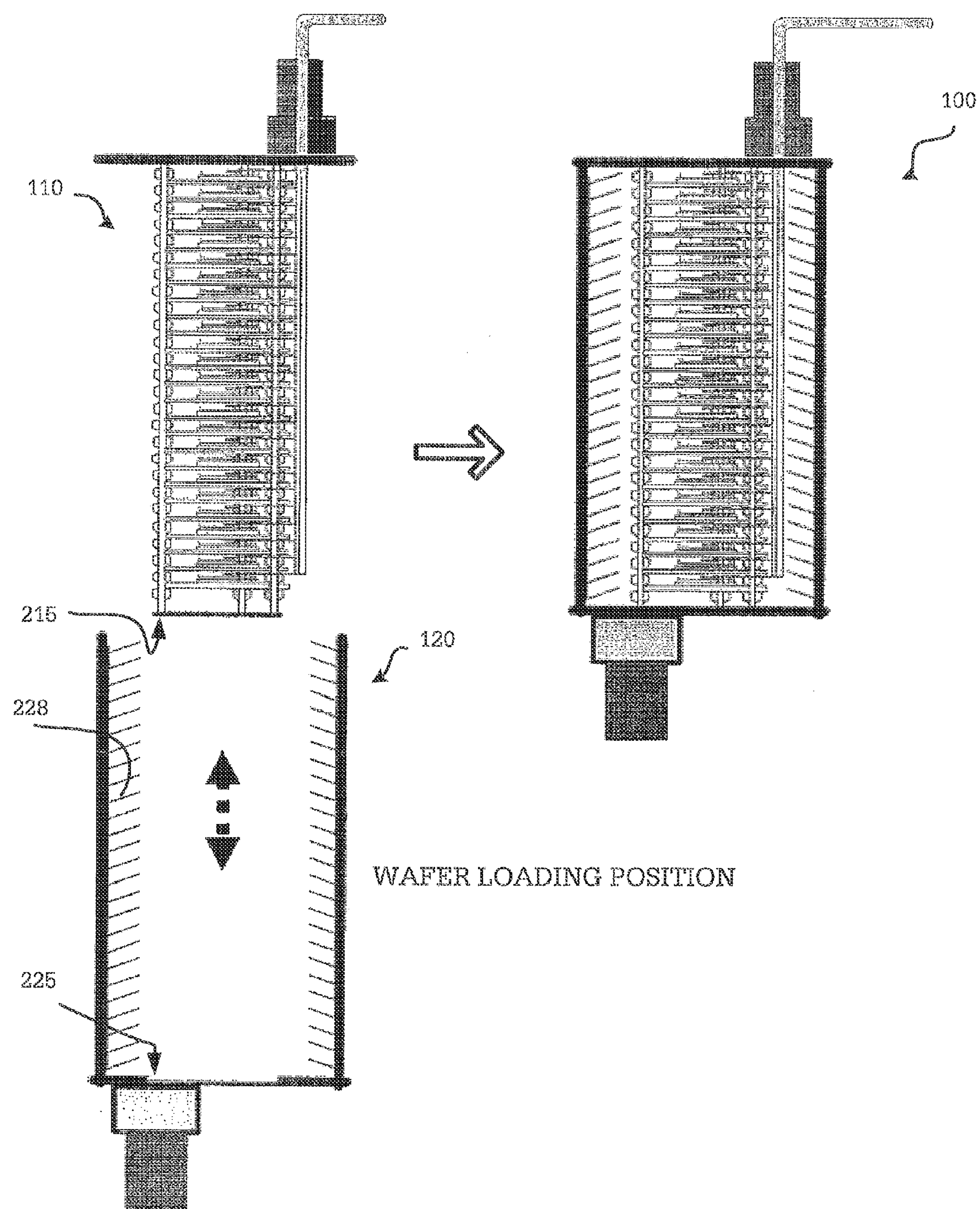
FIG. 2 illustrates a process cassette being loaded into a process chamber according to an embodiment of the present disclosure.

FIG. 2 illustrates a process cassette being loaded into a process chamber according to an embodiment of the present disclosure. According to an embodiment, process chamber 120 is moved vertically to allow loading and unloading of process cassette 110, which may be stationary. That is, when process chamber 120 is lowered to expose the process cassette 110, wafers that need to be processed may be loaded into the process cassette 110. When loading is complete, process chamber 120 may be raised to enclose the process cassette 110 for processing.

For embodiments in which the drive motor 130 is coupled to a bottom portion of the process chamber 120, a chamber motor coupling portion 225 at the bottom portion of the process chamber 120, and a cassette motor coupling portion 215 at a bottom portion of the process cassette 110 may be provided. That is, when the process chamber 120 is raised to enclose the multi-wafer clean processing system 100, the chamber motor coupling portion 225 is coupled to the cassette motor coupling portion 215 such that, during processing, the drive spool of the cassette is rotated by the drive motor 130.

As already discussed, the process chamber 120 may also include exhaust/drain waffles 228 to prevent backsplash of chemical from the chamber walls to the lower level floating chucks of the process cassette 110. Each of the exhaust/drain waffles 228 line the interior wall of the process chamber 120 and extend from the interior wall diagonally toward the top of the process chamber 120. As such, in embodiments in which the process chamber comprises a cylindrical shape, the exhaust/drain waffles 228 resemble rings that are vertically spaced apart. The angle of the exhaust/drain waffles 228 from the horizontal axis are such that when chemicals are applied from the nozzle to the wafer, the backsplash is caught by the exhaust/drain waffles 228 and drained along the wall of the process chamber 120.

When processing is complete, process chamber 120 may be lowered again so allow the processed wafers (e.g. cleaned wafers) to be unloaded from the process cassette 110 before unprocessed wafers are loaded. When the unprocessed wafers are loaded into the process cassette 110, process chamber 120 may be raised to enclose the multi-wafer clean processing system 100 and repeat the processing of the newly loaded unprocessed wafers.

In an embodiment, two or more process cassettes 110 may be provided to allow the efficient loading and unloading of the cassette. For example, during processing of a first process cassette, a second process cassette may be loaded with unprocessed wafers. When processing of the wafers in the first cassette is completed, the process chamber 120 is lowered. The process chamber 120 or the process cassettes may be capable of horizontal motion in such that the second process cassette may be placed directly above the process chamber 120. Then, the process chamber 120 may be raised to enclose the second process cassette for processing. During processing with the second process cassette, the processed wafers in the first process cassette may be unloaded, and the next set of unprocessed wafers may be loaded onto the first process cassette. In another embodiment, a third process cassette may be loaded with unprocessed wafers while the processed wafers in the first process cassette are unloaded. In essence, the number of process cassettes and the sequence of loading and unloading wafers may be adjusted to optimize the throughput of the multi-wafer clean processing system 100.

FIG. 3 illustrates a lateral view of a process cassette and a dispensing assembly according to an embodiment of the present disclosure. Process cassette 110 includes a plurality of spools. According to an embodiment, each spool may comprise a vertical spindle-like structure in which grooves or notches are spaced vertically apart to support an edge of a floating chuck 320. In the embodiment illustrated in FIG. 3, process cassette 110 comprises three spools 310*a-c* that are positioned approximately 120 degrees apart from the center of the horizontal plane. In an embodiment, each of the three spools include the same number of notches/grooves with corresponding notches/grooves at the same vertical position such that the floating chucks 320 may lay substantially flat one a horizontal plane when supported by the spools 310*a-c*.

In an embodiment, spool 310*a* may be the drive spool. That is, the cassette motor coupling portion 215 may be associated with spool 310*a*. When process chamber 120 is raised for processing, the cassette motor coupling portion 215 of spool 310*a* may be coupled to the chamber motor coupling portion 225 such that the drive motor 130 may rotate spool 310*a* about its vertical axis to rotate the floating chucks 320 that are being supported by the spools. In some embodiments, each of the spools 310*a-c* may have a cassette motor coupling portion such that the spool that is lined up with the chamber motor coupling portion 225 may act as the drive spool during processing.

The nozzle dispense assembly 140 may comprise a nozzle scan motor 330, at least one chemical line 340, a common swing system 350, and a plurality of nozzles 360. At least one chemical line 340 feeds the processing chemical, such as a cleaning agent (e.g. isopropyl alcohol, nitrogen gas, and such), to the nozzle dispense assembly 140. The common swing system 350, which comprises a substantially vertical tube-like shaft, is coupled to the nozzle scan motor 330. Each of the plurality of nozzles 360 comprises an arm that extends laterally from the common swing system 350. In an embodiment, each of the plurality of nozzles 360 may correspond with a notch (or groove) of the spools 310*a-c* to deliver the processing chemical to the corresponding wafer. That is, each nozzle 360 may extend laterally from the common swing system 350 to deliver the processing chemical on the top surface of the wafer that is securely positioned on the corresponding floating chuck 320.

The nozzle scan motor 330 drives the common swing system 350 in an oscillating motion such that the dispense nozzles 360 rotate clockwise and counter-clockwise about the vertical axis of the common swing system 350 inside the wall of the process chamber 120 while the drive spool 310*a* rotates the floating chuck 320. The angle of oscillating rotation may be determined based on the radius of the wafer or the floating chuck 320. In another embodiment, the common swing system 350 may operate similarly to a crankshaft such that when the nozzle scan of 330 rotates the common swing system 350, the alternating nozzles 360 move in toward the center of the floating chuck 320 and back toward the wail of the process chamber 120 in an oscillating manner. In essence, the nozzle dispense assembly 140 applies the processing chemical to the entire top surface of each wafer and allows all the wafers to be processed concurrently while the driving spool 310*a* rotates all the floating chucks in parallel.

FIGS. 4A-4C illustrate a floating chuck according to an embodiment of the present disclosure. FIG. 4A illustrates a top view of a floating chuck according to an embodiment of the present disclosure. As can be seen, spools 310*a-c* are positioned approximately 120 degrees apart about the center of the floating chuck 320. Although the top cross-sectional view for notches of the spools 310*a-c* resemble a substantially circular shape, this is only meant for illustrative purposes and is not intended to limit the scope of the disclosure. FIG. 4B illustrates a cross-sectional view of a floating chuck according to an embodiment of the present disclosure.

Floating chuck 320 is a substantially circular structure that comprises a lower portion 410, an upper portion 420, and a self-locking mechanism that comprises a plurality of pin assemblies 440. As can be seen in FIGS. 4A and 4B, the lower and upper portions 410 and 420 of the floating chuck 320 are substantially circular plates that are concentric (i.e. have a common center). In an embodiment, the lower portion 410 comprises a substantially circular shape with a radius that extends laterally such that the edge of the lower portion 410 rests on the notches of the spools 310*a-c*. The upper portion 420 may comprise a substantially circular shape with a radius that has a value between the radius of a wafer 430 and the radius of the lower portion 410. That is, the lower portion 410 interacts with the spools 310*a-c* and the upper portion 420 supports the wafer 430. Each pin assembly 440 in FIG. 4A is shown with dotted lines to represent that at least a portion of the pin assembly 440 may be located beneath the wafer 430 and/or beneath the upper portion 420 of the floating chuck 320. The dotted arrows on each pin assembly 440 represent that at least a portion of the pin assembly 440 may be rotated. This will be described further with respect to FIG. 4C.

In FIG. 4C, an exploded cross-sectional view of a portion 450 of FIG. 4B illustrates one of the pin assemblies 440 of the self-locking mechanism according to an embodiment of the present disclosure. In essence, the pin assemblies 440 of the self-locking mechanism work together to securely hold the wafer 430 in position using a centrifugal force that is generated when the floating chuck 320 is rotated.

In an embodiment, each pin assembly 440 may comprise a pin 442, a mechanical bearing 444, and an eccentric weight 445. The pin 442 may be fixed to a top surface of the mechanical bearing 44 such that the pin 442 extends vertically (or upwards at an angle) near an edge of the top surface of the mechanical bearing 444 that rotates about the vertical axis 448. The mechanical bearing 448 may be fastened at or near an outer edge of the upper portion 420 such that the mechanical bearing 448 has the same thickness as the upper portion 420. In another embodiment, circular cavities may be provided at or near a radial distance from the center of the upper portion 420.

The eccentric weight 445 is located in a hollow portion of the bottom portion 410 of the floating chuck 320, and one end of the eccentric weight 445 is coupled to the bottom of the mechanical bearing 444, such that the center of mass of the eccentric weight 445 is laterally offset from the vertical axis 448 (i.e. center of rotation of the mechanical bearing 444). Therefore, the mechanical bearing 444 operates as a pivot for the eccentric weight 445. Furthermore, the mechanical hearing 444 is configured such that, when the eccentric weight 445 turns about the vertical axis 448 (i.e. the pivot), the top surface of the mechanical bearing 444 also rotates, causing the pin 442 to move in a circular path about the vertical axis 448. That is, when the eccentric weight 445 turns about the pivot, the rotating motion is translated to the pin 442. In an alternate embodiment, the mechanical bearing 444 may be replaced by any other mechanism that can be used as a pivot for the eccentric weight. For example, the mechanical bearing 444 may include a hollow center portion. In an embodiment, the pin 442 may be directly fixed to the eccentric weight 445, which may be configured include a pivot that extends through the upper portion 420.

The self-locking mechanism, according to an embodiment, operates as follows. When the floating chuck 320 is resting (i.e. not being rotated), the pin 442 of each pin assembly 440 is located in a resting position such that the radial distance between the center of the upper portion 420 and the pin 442 is greater than the radius of the wafer 430. In an embodiment, a spring mechanism may be provided to hold the pin 442 in its resting position. When the floating chuck 320 is rotated by the drive motor 130, the centrifugal force generated by the rotation of the floating chuck 320 causes the eccentric weight 445, which is coupled to the mechanical bearing 444, to pivot about the vertical axis 448. The turning of the eccentric weight 445 about the vertical axis 448 (i.e. the pivot) of each pin assembly 440 causes the pin 442 to move in a circular motion about the vertical axis 448 until the pin 442 abuts against the edge of the wafer 430 and cannot move further.

As such, when the floating chuck 320 rotates, the pin 442 of each pin assembly 440 abuts against the edge of the wafer 430, causing the wafer 430 to be centered with respect to the rotation of the floating chuck 320 and securely held in place. In essence, the force of the self-locking mechanism is based at least partially on the rotational speed of the floating chuck 320. Therefore, as rotation of the floating chuck 320 slows to a halt, the pins 442 of the self-locking mechanism release the wafer 430. Consequently, the self-locking mechanism, as described, can be used to center and secure hold wafers with different dimensions based on the range of motion for the pin assembly 440. Therefore, it may not be necessary to modify a floating chuck based on wafer size.

In FIG. 4C pin 442 of the in assembly 440 shown to have a bottom portion that is substantially conical (or prism-like) and a flat top portion such that, when the floating chuck 320 rotates, the wafer 430 is elevated as the pins 442 move inwards in a circular path about the vertical axis 448 after making contact with the wafer 430 until the top surface of the wafer 430 abuts the flat top portion of the pin 442. In other embodiments, pin 442 may comprise any other shape (e.g. a straight pin or a hook) that is appropriate for securely holding the wafer 430 in position during rotation of the floating chuck 320.

Furthermore, FIG. 4A illustrates a self-locking mechanism that comprises six pin assemblies 440 that are spaced apart substantially equal angles from each other and at an equal distance with respect to the center of the upper portion 420 of the floating chuck 320. However, this is merely for illustrative purposes and not meant to limit the scope of the present disclosure. In other embodiments, the self-locking mechanism of the floating chuck 320 may comprise three or more pin assemblies 440. In some embodiments, the pin assemblies 440 may not be spaced at substantially equal angles from each other with respect to the center of the floating chuck 320.

In the embodiment illustrated in FIGS. 4A and 4C, one end of the eccentric weight 445 is coupled to the mechanical bearing 444 such that, when in a resting position, the majority of the eccentric weight 445 extends toward the center of the floating chuck 320. In FIGS. 4A and 4C, the eccentric weight 445 is illustrated as having an elliptical (or oval) shape comprising a flat top surface and a flat bottom surface. However, this is merely for illustrative purposes and is not intended to limit the shape or orientation of the eccentric weight 445. For example, the eccentric weight 445 may be coupled to the mechanical bearing 444 such that, when in a resting position, the majority of the eccentric weight 445 extends away from the center of the floating chuck 320. That is, the eccentric weight 445 may comprise any shape and may be oriented in any way as long as the center at mass of the eccentric weight 445 is laterally offset with respect to the vertical axis 448 such that the rotation of the floating chuck 320 causes the eccentric weight 445 to rotate about the vertical axis 448, thereby causing the pin 442 of each pin assembly 440 to move toward the center of the wafer 430.

In an embodiment, the lower portion 410 may be a single circular plate comprising a plurality of hollow portions, where each hollow portion accommodates the rotation of an eccentric weight 445. In another embodiment, the lower portion 410 may comprise an inner circular plate portion and an outer circular ring, such that the gap between the inner circular plate portion and the outer circular ring provides sufficient space for the rotation of the eccentric weights 445. In yet another embodiment, the lower portion 410 may be a single ring-shaped plate with a hollow center to accommodate the eccentric weights 445. In some embodiments, the hollow portions of the lower portion 410 of each floating chuck 320 may be enclosed to prevent the eccentric weight 445 from being exposed.

Figure 5:
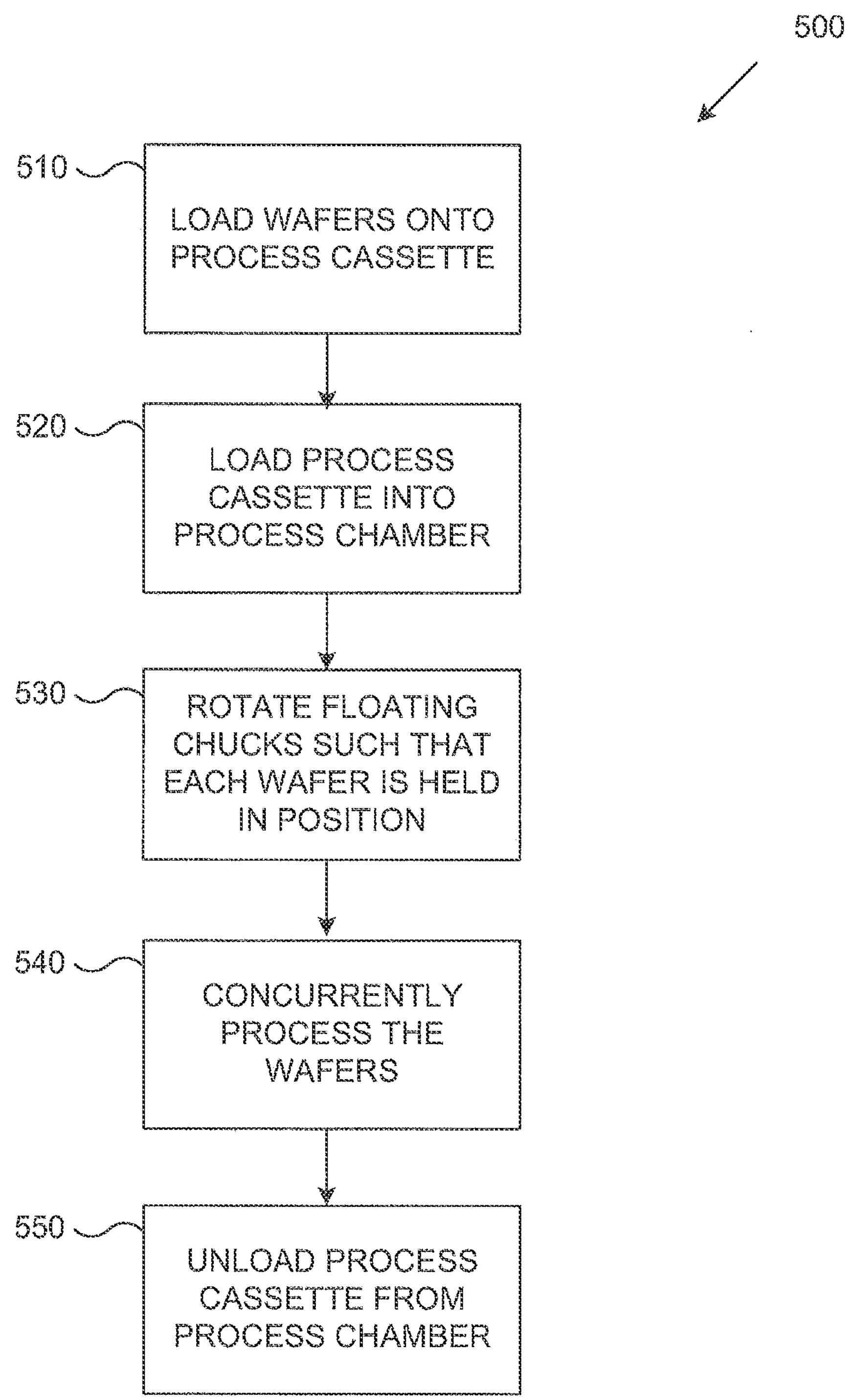
FIG. 5 illustrates a process for processing multiple wafers in parallel according to an embodiment of the present disclosure.

FIG. 5 illustrates a process 500 for processing multiple wafers in parallel according to an embodiment of the present disclosure. In block 510, wafers (e.g. wafers 430) are loaded onto a process cassette (e.g. process cassette 110). That is, each wafer 430 is loaded onto the upper portion 420 of a floating chuck 320 such that the pins 442 of the pin assemblies surround the wafer 430. Block 510 assumes that the process cassette 110 is not currently enclosed by the process chamber 120 (e.g. the process chamber 120 has been lowered to expose the process cassette 110, or the process chamber 120 is currently being used to process another process cassette). In another embodiment, the wafers 430 may first be loaded onto the floating chucks 320, and the floating chucks may then subsequently be loaded onto the spools to form the process cassette 110.

In block 520, the process cassette 110 is loaded into the process chamber 120. In an embodiment, the process chamber 120 raised to enclose the process cassette 110. In another embodiment, the process cassette is lowered into the process chamber 120. When loaded, process cassette 110 is positioned such that the drive spool 310*a* is coupled to the drive motor 130. In an embodiment, the chamber motor coupling portion 225 is coupled to the cassette motor coupling portion 215.

In block 530, the floating chucks 320 are rotated. That is, the drive motor 130 rotates the drive spool 310*a* which then causes the floating chucks 320 in the process cassette 110 to rotate. Rotating the floating chucks 320 subsequently causes the other spools 310*b* and 310*c* to also rotate by frictional force. Meanwhile, the centrifugal force generated by the rotation of the floating chucks 320 activates the self-locking mechanism. As discussed with regard to FIGS. 4A-4C, a self-locking mechanism comprising pin assemblies 440 is provided for each floating chuck 320 to secure hold the wafer r 430 at the center with respect to the axis of rotation of the floating chuck 320. In an embodiment that comprises multiple process cassettes, another process cassette may be prepared by loading the next batch of unprocessed wafers. Furthermore, a previously processed cassette may be unloaded. Alternatively, if the multi-wafer clean processing system 100 includes two process cassettes and a first process cassette is currently loaded into the process chamber 120, processed wafers are unloaded from the exposed process cassette, and unprocessed wafers are subsequently loaded onto the exposed process cassette.

In block 540, the wafers in the process cassette 110 may be processed concurrently. The nozzle scan motor also drives the common swing system 350 to cause the nozzles 360 to oscillate. At least one chemical line 340 draws a processing chemical through the common swing system 350 to the nozzles 360, which deliver the processing chemical to the wafers 430. The backsplash of the processing chemical is collected by the plurality of exhaust/drain waffles 228. In the embodiment that comprises multiple process cassettes, one or more exposed process cassettes are prepared for processing, as described with regard to block 530.

After the multi-wafer clean processing system 100 has completed processing wafers 430, the process cassette 110 is unloaded from the process chamber 120 (block 550). In an embodiment, the process chamber 120 is lowered to expose the process cassette 110. In another embodiment, the process cassette 110 is raised from the process chamber 120. In an embodiment in which the multi-wafer clean processing system 100 includes a single process cassette, when the process cassette 110 is unloaded, the processed wafers 430 may be unloaded from the floating chucks 320 of the process cassette 110, and the process may return to block 510 to load the next batch of unprocessed wafers onto the process cassette 110.

Alternatively, in embodiments in which the multi-wafer clean processing system 100 comprises two or more process cassettes, the process returns to block 520 and loads the next process cassette into the process chamber 120. The processed wafers 430 may then be unloaded, from process cassette 110 concurrently while the multi-wafer clean process resumes in block 530.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for concurrently processing at least a first wafer and a second wafer, the method comprising:

receiving, by a first chuck, the first wafer;

receiving, by a second chuck, the second wafer, wherein the first chuck and the second chuck are coupled on periphery edges to a drive spool and vertically aligned such that the second chuck is disposed below the first chuck;

receiving, by a chamber, the first chuck and the second chuck; and rotating, by a drive motor coupled to the drive spool, the first chuck and the second chuck via the drive spool to hold the first wafer in a first position on the first chuck and the second wafer in a second position on the second chuck for processing.

2. The method of claim 1, wherein the drive spool is configured to maintain a parallel alignment of the first chuck and the second chuck.

3. The method of claim 1, wherein rotating the first chuck and the second chuck generates a centrifugal force to lock the first wafer in the first position on the first chuck and the second wafer in the second position on the second chuck.

4. The method of claim 3, wherein the centrifugal force locks the first wafer in the position on the first chuck via at least one first pin assembly that is rotatably attached to the first chuck at a radial distance from a center of rotation of the first chuck, wherein the at least one first pin assembly comprises a first pin that extends above a first circular portal of an upper portion of the first chuck, and a first eccentric weight that turns about the first circular portal and is retained in a cavity of a lower portion of the first chuck, and wherein the centrifugal force locks the second wafer in the position on the second chuck via at least one second pin assembly that is rotatably attached to the second chuck at a radial distance from a center rotation of the second chuck, wherein the at least one second pin assembly comprises a second pin that extends above a second circular portal of an upper portion of the second chuck and a second eccentric weight that turns about the second circular portal and is retained in a cavity of a lower portion of the second chuck.

5. The method of claim 4, wherein the centrifugal force causes the first eccentric weight to turn about the first circular portal and causes the first pin to move in a circular path about a center of the first circular portal.

6. The method of claim 1, wherein the drive motor is disposed at a bottom external portion of the process chamber.

7. The method of claim 1, further comprising concurrently dispensing chemicals on the first wafer and the second wafer while the first chuck and the second chuck are rotating.

8. The method of claim 1, wherein the chamber comprises exhaust or drain waffles configured to prevent backsplash of chemicals from walls of the chamber to lower level chucks.

9. The method of claim 1, further comprising concurrently dispensing, by a nozzle dispense assembly, chemicals onto the first wafer and the second wafer; and inhibiting backsplash of chemicals using drain ducts disposed along at least a side wall of the chamber.

10. The method of claim 9, wherein the nozzle dispense assembly comprises:

at least one chemical line configured to receive a processing chemical;

a common swing system configured to couple a nozzle scan motor to each of a plurality of nozzles;

the plurality of nozzles configured to deliver the processing chemical to a corresponding wafer; and the nozzle scan motor configured to drive the common swing system in an oscillating motion such that the plurality of nozzles rotates clockwise and counterclockwise about a vertical axis of the common swing system inside a wall of the chamber while the drive spool rotates a respective chuck.

11. A method of concurrently processing a plurality of wafers, the method comprising:

supporting, by a processing cassette comprising one or more rotatable spools, a plurality of floating chucks, wherein a first chuck is coupled on a periphery edge to the one or more rotatable spools and configured to receive a first wafer, and a second chuck is coupled on a periphery edge to the one or more rotatable spools and configured to receive a second wafer, and wherein the first chuck and the second chuck are vertically aligned such that the second chuck is disposed below the first chuck;

moving the processing cassette including the first chuck and the second chuck into a processing chamber; and rotating, by a drive motor, at least one of the one or more rotatable spools, wherein the rotating the at least one or more rotatable spools comprises causing the first chuck to rotate and hold the first wafer in a first position on the first chuck and causing the second chuck to rotate and hold the second wafer in a second position on the second chuck; and concurrently processing the first and second wafers.

12. The method of claim 11, wherein the one or more rotatable spools are configured to maintain a parallel alignment of the first chuck and the second chuck.

13. The method of claim 11, wherein causing the first chuck and the second chuck to rotate further comprises generating a centrifugal force to lock the first wafer in the first position on the first chuck, and the second wafer in the second position on the second chuck.

14. The method of claim 13, wherein the centrifugal force locks the first wafer in the position on the first chuck via at least one first pin assembly that is rotatably attached to the first chuck at a radial distance from a center of rotation of the first chuck, wherein the at least one first pin assembly comprises a first pin that extends above a first circular portal of an upper portion of the first chuck, and a first eccentric weight that turns about the first circular portal and is retained in a cavity of a lower portion of the first chuck, and wherein the centrifugal force locks the second wafer in the position on the second chuck via at least one second pin assembly that is rotatably attached to the second chuck at a radial distance from a center rotation of the second chuck, wherein the at least one second pin assembly comprises a second pin that extends above a second circular portal of an upper portion of the second chuck and a second eccentric weight that turns about the second circular portal and is retained in a cavity of a lower portion of the second chuck.

15. The method of claim 14, wherein the centrifugal force causes the first eccentric weight to turn about the first circular portal and causes the first pin to move in a circular path about a center of the first circular portal.

16. The method of claim 11, wherein the drive motor is disposed at a bottom external portion of the processing chamber.

17. The method of claim 11, further comprising concurrently dispensing chemicals on the first wafer and the second wafer while the first chuck and the second chuck are rotating.

18. The method of claim 11, wherein the processing chamber comprises exhaust or drain waffles configured to prevent backsplash of chemicals from walls of the processing chamber to lower level chucks.

19. The method of claim 17, further comprising concurrently dispensing, by a nozzle dispense assembly, chemicals onto the first wafer and the second wafer; and inhibiting backsplash of chemicals using drain ducts disposed along at least a side wall of the processing chamber.

20. The method of claim 19, wherein the nozzle dispense assembly comprises:

at least one chemical line configured to receive a processing chemical;

a common swing system configured to couple a nozzle scan motor to each of a plurality of nozzles;

the plurality of nozzles configured to deliver the processing chemical to a corresponding wafer; and the nozzle scan motor configured to drive the common swing system in an oscillating motion such that the plurality of nozzles rotate clockwise and counter-clockwise about a vertical axis of the common swing system inside a wall of the processing chamber while a drive spool rotates a respective chuck.

* * * * *